United States Patent [19]

Campbell et al.

[11] 3,790,947

[45] Feb. 5, 1974

[54] METHOD AND MEANS FOR INCREASING THE RESOLTUION OF ANALOG-TO-DIGITAL CONVERTER SYSTEMS

[75] Inventors: Curtis M. Campbell; Walter J. McConnell; Edmund R. Skutecki, all of Phoenix, Ariz.

[73] Assignee: Sperry Rand Corporation, New York, N.Y.

[22] Filed: Nov. 17, 1971

[21] Appl. No.: 199,698

[52] U.S. Cl. .......................... 340/347 AD, 325/38 B

[51] Int. Cl. ....................... H03k 13/02, H03k 13/22

[58] Field of Search 340/347 SH, 347 AD; 325/38 R, 325/38 B

[56] References Cited

UNITED STATES PATENTS

| | | | |
|---|---|---|---|
| 3,623,071 | 11/1971 | Bentlye | 340/347 AD |
| 3,571,758 | 3/1971 | DeFrancesco | 340/347 AD |

*Primary Examiner*—Paul J. Henon
*Assistant Examiner*—Leo H. Boudreau
*Attorney, Agent, or Firm*—Howard P. Terry

[57] ABSTRACT

An increased resolution analog-to-digital converter system comprises a sample and hold circuit for storing an instantaneous value of the analog input signal to be converted. A difference amplifier coupled to receive the output of the sample and hold circuit and the analog input signal provides the difference therebetween with a gain of K. The outputs from the sample and hold circuit and the difference amplifier are transformed to digital format by analog-to-digital converter means. The digitally converted signal from the sample and hold circuit is shifted in the direction of increasing bit significance a number of places equal to $\log_2 K$. The digitally converted signal from the difference amplifier is added to the shifted signal to provide the increased resolution digital output signal.

9 Claims, 1 Drawing Figure

PATENTED FEB 5 1974 3,790,947
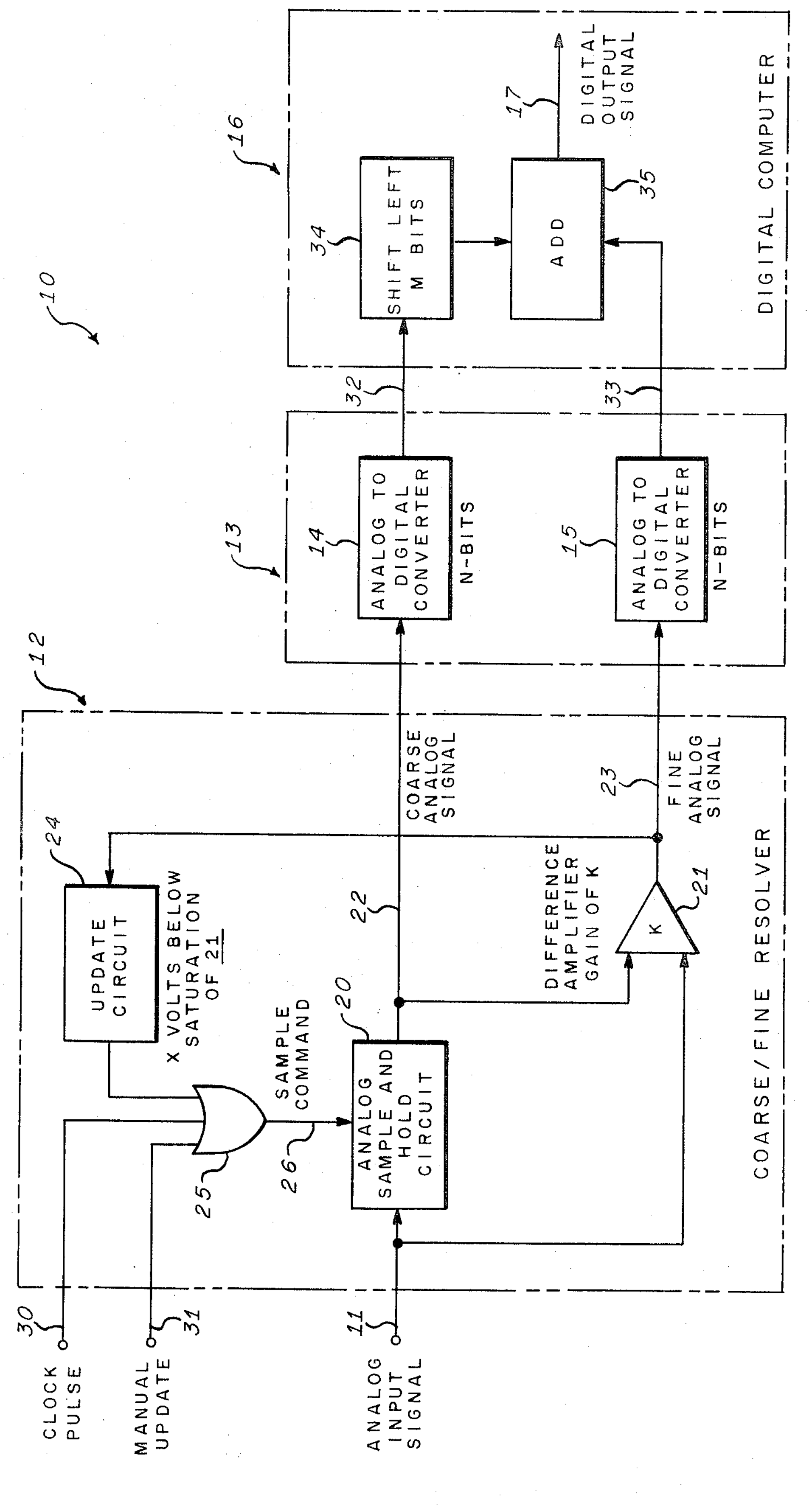

METHOD AND MEANS FOR INCREASING THE RESOLTUION OF ANALOG-TO-DIGITAL CONVERTER SYSTEMS

The invention herein described was made in the course of or under a contract or sub-contract thereunder with the Department of the Navy.

BACKGROUND OF THE INVENTION

1. Field of the Invention

The present invention pertains to analog-to-digital converter systems, particularly with regard to method and means for increasing the resolution thereof.

2. Description of the Prior Art

Prior art systems are known that utilize digital computers to perform the computation and control functions required thereof in response to a multiplicity of input sensor signals. Normally the input parameters are in analog form thus requiring large numbers of analog-to-digital conversions to transform the analog input signals to the digital form required by the digital computer. The digital work length required in a conversion is a function of the expected range of the associated input parameter and the resolution required thereof. A signal that assumes a wide range of values and must be resolved to a small increment thereof requires a significantly longer digital word length than an input signal with a limited range of values. Normally in such systems, an analog-to-digital converter is utilized time shared by multiplexing apparatus amongst the various analog input signals. In prior practice, the converter is chosen to have a word length or bit capacity selected in accordance with the input signal having the most stringent requirements. Thus, it is appreciated that in systems having only a relatively small number of input signals requiring long digital word lengths, an excessive bit capacity is provided in the converter with respect to the limited range input signals resulting in an unduly complex and expensive instrumentation. Additionally, utilizing this prior art design approach, it would be exceedingly impractical to include in an existing system a further input signal with a resolution requirement necessitating a longer digital word length than that provided by the existing converter.

An example of such apparatus is a digital computer controlled aircraft flight control system having analog input signals proportional to such variables as vehicle heading, pitch and roll attitudes and the rates thereof, longitudinal and lateral linear acceleration as well as vehicle position variables such as flight path deviation, altitude, range from destination (DME) as well as airspeed. It will be appreciated that most of these variables are normally small scale numbers. However, the variables such as altitude, airspeed and distance are large scale numbers requiring a greater converter bit capacity than the small scale numbers in order to obtain adequate resolution of the signals to provide proper control of the aircraft. In a practical instrumentation of such a system, it was found that a 12 bit word length provided adequate resolution for most of the input signals. However, 16 bits of resolution were required for the few large scale variables.

It is known in the analog-to-digital converter art that converters providing word length of up to approximately 12 bits have a certain cost per bit associated therewith. Commercially procurable converters of word lengths substantially greater than 12 bits have a significantly larger cost per bit associated therewith compared to the smaller systems; for example, a commercially available 12 bit converter may cost approximately $500 whereas a 16 bit converter may cost $1,600. Thus it is appreciated that in the system exemplified above should a 16 bit converter be utilized, not only would undue complexity and hence excessive expense be introduced into the apparatus because of the unnecessarily large bit capacity for most of the input signals, but additional expense would be incurred because of the unusually long word length.

SUMMARY OF THE INVENTION

The present invention provides method and apparatus for increasing the effective resolution of an analog-to-digital converter to a value greater than that provided by the actual word length or bit capacity thereof.

The present invention also provides greater flexibility than prior art systems since the resolution of an input signal channel can be altered by changing the gain of an amplifier.

The invention comprises a circuit for holding a sampled value of the analog input signal. A subtracting circuit is included to provide the difference between the analog input signal and the sampled value thereof. The sampled value of the analog input signal and the difference signal from the subtracting circuit are converted to digital representations thereof by analog-to-digital converter means. The digital representations of the sampled value of the analog input signal and the difference signal are combined to provide the increased resolution digital output signal.

BRIEF DESCRIPTION OF THE DRAWING

The sole FIGURE is a schematic block diagram illustrating an analog-to-digital converter channel in accordance with the invention.

DESCRIPTION OF THE PREFERRED EMBODIMENT

Referring to the sole FIGURE, an analog input signal channel 10 of a digital computer-controlled system is illustrated. Particularly, the channel 10 has an input signal requiring a high resolution. The analog input signal to the channel 10 is applied to a terminal 11 and, after processing in a coarse/fine resolver 12, in accordance with the invention, is transmitted to analog-to-digital converter means 13. The analog-to-digital converter means 13, in actual embodiments, is normally comprised of a single analog-to-digital converter multiplexed amongst the various analog input signal channels. The output of the analog-to-digital converter is then de-multiplexed to provide to the digital computer of the system the plurality of digitally converted signals corresponding to the plurality of analog input signals. It will be appreciated, however, that for purposes of clarity of explanation, the analog-to-digital converter means 13 is illustrated comprising analog-to-digital converters 14 and 15 for reasons to be discussed hereinafter.

The output of the analog-to-digital converter means 13 is applied as an input to a digital computer 16 which processes the digital signals from the converter means 13 in accordance with the concept of the invention to provide a digital output signal at 17 corresponding to the analog input signal on the terminal 11.

It will be appreciated that the normally multiplexed converter 13 provides signals to the computer 16 corresponding to all of the analog inputs to the system, the computer 16 providing the corresponding digital outputs at 17. Those analog input signals that do not require greater resolution than that provided by the bit capacity of the converter 13 are multiplexed directly into the converter 13. Those analog input signals requiring greater resolution than that provided by the bit capacity of the converter 13 are multiplexed thereinto via a coarse/fine resolver exemplified at 12. The digital computer 16, in response to the digital signals at 17, then provide the necessary control signals to operate the system in a manner well appreciated in the art.

Considering now the coarse/fine resolver 12 of a high resolution input channel, the analog input signal at the terminal 11 is applied to an analog sample and hold circuit 20 and to a difference amplifier 21. The output of the sample and hold circuit 20 is applied to a lead 22 and as a second input to the difference amplifier 21. The difference amplifier 21 provides a signal on a lead 23 proportional to the difference between the output of the sample and hold circuit 20 and the analog input signal at the terminal 11 with a gain of K.

The output of the difference amplifier 21 is applied as an input to an automatic updating circuit 24. The automatic updating circuit 24 is a conventional device such as, for example, a Schmitt trigger for providing an output pulse whenever the input thereto exceeds a predetermined threshold. The pre-determined threshold of the circuit 24 is selected at an arbitrary value below the saturation voltage of the amplifier 21 for reasons to be explained.

The output of the automatic updating circuit 24 is applied as an input to an OR gate 25 which, in turn, provides a sample command on a lead 26 to the sample and hold circuit 20. The OR gate 25 also receives inputs on terminals 30 and 31 of a clock pulse signal and a manual updating signal respectively for reasons to be discussed.

The sample and hold circuit 20 provides an output on the lead 22 equal to the analog input at the terminal 11 whenever a sample command pulse is applied to the lead 26 and holds this instantaneous value of the analog input signal at the terminal 11 on the lead 22 until the next occurring sample command pulse on the lead 26. It is appreciated that when the sample command pulse is applied on the lead 26, the difference between the signal on the lead 22 and the signal at the terminal 11 is zero and, therefore, the output of the difference amplifier 21 on the lead 23 is zero. When the sample command pulse is removed from the lead 26, the output of the sample and hold circuit 20 on the lead 22 becomes fixed at the instantaneous value of the analog input signal at the time of occurrence of the sample command pulse. Any subsequent change in the anlog input signal at the terminal 11 results in a non-zero output from the difference amplifier 21 on the lead 23, which signal on the lead 23 is proportional to the change in the analog input signal multiplied by the gain K of the difference amplifier 21. The signals on the lead 22 and 23 may be considered as the "coarse" and "fine" analog signal components of the analog input signal at the terminal 11. It will be appreciated that the fine signal on the lead 23 is scaled by the difference amplifier 21 to have a significance of K times the coarse signal on the lead 22.

The coarse and fine analog signal components on the leads 22 and 23 are converted to digital form by the analog-to-digital converters 14 and 15 respectively. It will be appreciated that in a practical system a single analog-to-digital converter would be utilized with the coarse and fine signals multiplexed thereinto. The bit capacity or word length of the analog-to-digital converter 14, 15 may be designated as N bits.

The converted coarse and fine signals from the analog-to-digital converters 14 and 15 are applied on leads 32 and 33, respectively, as inputs to the digital computer 16. The computer 16 is programmed to shift the coarse digital word on the lead 32 M bits in the direction of increasing bit significance where M equals the number of bits of increased resolution desired for the input channel 10. The least significant end of the coarse digital word is zero filled in accordance with the number of places shifted. These operations are indicated at 34.

The computer 16 is further programmed to add the shifted coarse word at 34 to the fine digital word on the lead 33 to provide the increased resolution digital output signal at 17. This addition operation is indicated at 35.

It will be appreciated that the M bit shift of the coarse digital word at 34 is equivalent to multiplying the word by the factor $2^M$. Selecting the gain $K$ of the difference amplifier 21 such that $K = 2^M$ results in scaling both the coarse and the fine signals by the same factor. Thus, the addition operation at 35 results in an increased resolution digital output signal at 17 of word length N+M bits.

Although the coarse digital word is multiplied by the factor K at 34 by the shifting operation described, it will be appreciated that the computer 16 may alternatively be programmed to multiply the coarse digital word by the factor K by utilizing the MULTIPLY instruction thereof. In this manner the values of the factor K are not limited to powers of 2. It is furthermore appreciated that although the shifting or multiplying operation at 34 and the addition operation at 35 may be performed by the programmed computer 16, these operations may alternatively be instrumented as hardware in a manner well understood by practitioners in the art.

Referring again to the coarse/fine resolver 12, the amount of change of the analog input signal at the terminal 11 that the difference amplifier 21 may be permitted to detect during a hold period between sample command pulses on the lead 26, is limited by the saturation voltage of the amplifier 21. The automatic updating circuit 24 monitors the output of the difference amplifier 21 and provides a sample command pulse whenever the difference amplifier output attains a predetermined threshold that is set below the saturation point of the amplifier 21. Additionally, sample command pulses on the lead 26 may be provided at the terminal 31 from a manual up-dating signal or at the terminal 30 as a function of a clock pulse signal.

It will be appreciated that in the specific application of the invention discussed above with respect to the digital flight control system, utilization of a 12-bit converter resulted in a range dead zone of over 500 feet whereas when utilizing the 12-bit converter in accordance with the invention with $M=4$, a resolution of less than 25 feet was achieved.

It will be appreciated from the foregoing that greater flexibility compared to prior art design is achieved by utilizing the present invention. It is practical when using the invention to include in an existing system a further input signal with a resolution requirement necessitating a longer digital word length than that provided by the existing converter. The resolution of a channel is readily altered by changing the gain of the amplifier 21.

While the invention has been described in its preferred embodiment, it is to be understood that the words which have been used are words of description rather than limitation and that changes within the purview of the appended claims may be made without departing from the true scope and spirit of the invention in its broader aspects.

We claim:

1. A system for increasing the resolution of an analog-to-digital converter comprising an input terminal for receiving an analog signal, a sample and hold circuit coupled to said input terminal for holding and providing an instantaneous value of said analog signal thereby providing a sampled value thereof, subtractor means having two inputs coupled to said input terminal and to the output of said sample and hold circuit respectively for providing the difference between the current value of said analog signal and said sampled value at a gain factor of K greater than unity, analog-to-digital converter means coupled to said sample and hold circuit and to said subtractor means for converting said sampled value and said difference to digital representations thereby providing first and second digital signals respectively, multiplier means coupled to said analog-to-digital converter means for multiplying said first digital signal by said factor K thereby providing a third digital signal, and adder means having two inputs coupled to said multiplier means and to said analog-to-digital converter means respectively for adding said second digital signal to said third digital signal to provide a digital output signal corresponding to said current value of said analog signal at a resolution greater than that provided by said analog-to-digital converter means.

2. The system of claim 1 in which said multiplying means comprises means for shifting said first digital signal in the direction of increasing digit significance a number of positions M where $K = 2^M$.

3. The system of claim 1 in which said subtractor means comprises a different amplifier with a gain of K.

4. The system of claim 5 in which said sample and hold circuit includes a sample command input.

5. The system of claim 4 further including updating circuit means coupled to the output of said difference amplifier for providing a sample command signal to said sample command input whenever said difference exceeds a predetermined threshold.

6. Apparatus for use in a system for increasing the resolution of an analog-to-digital converter in which said system includes analog-to-digital converter means for converting coarse and fine analog signals to digital representations thereby providing first and second digital signals respectively, multiplier means coupled to said analog-to-digital converter means for multiplying said first digital signal by a factor K greater than unity thereby providing a third digital signal and adder means having two inputs coupled to said multiplier means and to said analog-to-digital converter means respectively for adding said second digital signal to said third digital signal to provide a digital output signal corresponding to the current value of said analog signal at a resolution greater than that provided by said analog-to-digital converter means, said apparatus comprising in combination:

an input terminal for receiving an analog signal, a sample and hold circuit coupled to said input terminal for holding and providing an instantaneous value of said analog signal thereby providing a sampled value thereof, and subtractor means having two inputs coupled to said input terminal and to the output of said sample and hold circuit respectively for providing the difference between said current value of said analog signal and said sampled value at a gain factor of K greater than unity, said analog-to-digital converter means being coupled to said sample and hold circuit and to said subtractor means for converting said sampled value and said difference to digital representations thereby providing said first and second digital signals respectively.

7. The apparatus of claim 6 in which said substractor means comprises a difference amplifier with a gain of K.

8. The apparatus of claim 7 in which said sample and hold circuit includes a sample command input.

9. The apparatus of claim 8 further including updating circuit means coupled to the output of said difference amplifier for providing a sample command signal to said sample command input whenever said difference exceeds a predetermined threshold.

* * * * *